(12) United States Patent
Pöchmüller (10) Patent No.: US 6,822,913 B2
(45) Date of Patent: Nov. 23, 2004

(54) INTEGRATED MEMORY AND METHOD FOR OPERATING AN INTEGRATED MEMORY

(75) Inventor: Peter Pöchmüller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/368,081

(22) Filed: Feb. 18, 2003

(65) Prior Publication Data

US 2003/0156453 A1 Aug. 21, 2003

(30) Foreign Application Priority Data

Feb. 18, 2002 (DE) .......................................... 102 06 689

(51) Int. Cl.⁷ ............................................... G11C 7/00
(52) U.S. Cl. .................................... 365/201; 365/200
(58) Field of Search ............................. 365/201, 200; 714/754, 746

(56) References Cited

U.S. PATENT DOCUMENTS

| | | | | |
|---|---|---|---|---|
| 5,172,339 A | * | 12/1992 | Noguchi et al. ............ | 365/201 |
| 5,179,536 A | * | 1/1993 | Kasa et al. .................. | 365/200 |
| 5,233,610 A | * | 8/1993 | Nakayama et al. ......... | 714/704 |
| 5,359,722 A | * | 10/1994 | Chan et al. .................. | 713/600 |
| 5,450,424 A | * | 9/1995 | Okugaki et al. ............ | 714/772 |
| 6,065,146 A | | 5/2000 | Bosshart ..................... | 714/754 |

* cited by examiner

Primary Examiner—Anh Phung
(74) Attorney, Agent, or Firm—Laurence A. Greenberg; Werner H. Stemer; Ralph E. Locher (57) ABSTRACT

An integrated memory includes memory cells arranged in a memory cell array and a read/write amplifier for evaluating and amplifying data signals of the memory cells that are being read out or written to. An error correction circuit is connected to the read/write amplifier. Data signals of selected memory cells that are to be read out or written are received by the error correction circuit, checked for errors, and in the case of a detected erroneous data signal, the erroneous data signal is corrected by being inverted and is output. The memory, even in the case of a defective memory cell, in particular a memory cell with a variable memory cell time or retention time (also called VRT-Variable Retention Time), can nevertheless largely be operated reliably.

18 Claims, 4 Drawing Sheets

Prior Art

INTEGRATED MEMORY AND METHOD FOR OPERATING AN INTEGRATED MEMORY

BACKGROUND OF THE INVENTION

FIELD OF THE INVENTION

The present invention relates to an integrated memory and a method for operating an integrated memory.

With increasing storage density and increasing miniaturization of integrated memories, in particular, in the form of DRAMs (Dynamic Random Access Memories), it is generally becoming more and more difficult to fabricate memory modules. This is principally due to the fact that an increasingly greater effort and expense are required to realize increasingly larger numbers of defect-free memory cells. For this reason, present-day DRAM memory modules usually have a large number of redundant memory cells that can replace defective normal memory cells. This means that numerous inactive redundant memory cells are provided in order to replace, if appropriate, defective normal memory cells by the redundant memory cells. The redundant memory cells are usually activated by programming programmable elements, for example, in the form of so-called laser fuses or electrically programmable fuses, which can be used to program an address of one or more normal memory cells that will be replaced.

With increasing circuit miniaturization, specific semiconductor effects come more and more into play. One of these artifacts is e.g. a variable memory cell time or retention time, also called VRT (Variable Retention Time). In memory cells affected by VRT, the memory time or retention time of the cell changes suddenly. Usually, a memory cell can store, for a specific time, for example 200 ms, enough charge to achieve a sufficiently strong read signal during the read-out of the memory cell. This memory behavior usually does not change significantly over the operating time of the memory module. In memory cells affected by VRT, however, the memory behavior changes suddenly and completely unpredictably. Thus, it can happen e.g. that a memory cell affected by VRT, after days in operation, suddenly changes its memory behavior in such a way that it can store its charge e.g. only for a time of 10 ms, instead of for a time of 200 ms. This state can change again after a period of time, so that the affected memory cell again has the normal memory behavior or the normal retention time of 200 ms.

The problem of a variable memory cell time represents a serious abnormal behavior since affected memory cells, in the application, can lead to a failure and thus to an abnormal behavior of the entire memory. What is more, it is practically impossible to detect and find memory cells affected by VRT in a functional test and to repair them by redundant memory cells, since they mainly exhibit normal behavior during the test phase, which is generally carried out directly after the fabrication of the memory. If a memory product is affected by VRT, then it cannot be supplied to the customer, but rather must be considered to be a reject. To date, it has been attempted to reduce the problem of variable memory cell time to the largest possible extent by technological measures, for example, by avoiding any type of dislocations in the silicon.

SUMMARY OF THE INVENTION

It is accordingly an object of the invention to provide an integrated memory and a method of operating the integrated memory which overcomes the above-mentioned disadvantages of the prior art apparatus and methods of this general type.

In particular, it is an object of the invention to provide an integrated memory that can, for the most part, be operated reliably against the background of the abovementioned problem area. Furthermore, it is an object of the present invention to specify a method that allows the integrated memory, for the most part, to be operated reliably against the background of the abovementioned problem area.

With the foregoing and other objects in view there is provided, in accordance with the invention, an integrated memory including: a memory cell array having a plurality of memory cells; a read/write amplifier for evaluating and amplifying data signals being read out from or written to the plurality of memory cells of the memory cell array; and an error correction circuit connected to the read/write amplifier. The error correction circuit is capable of being activated when reading out from or writing to the memory cell array. The error correction circuit is for receiving and checking the data signals, which are being read out from or written to the memory cell array, for errors. The error correction circuit, upon detecting an erroneous data signal, corrects the erroneous data signal by inverting the erroneous data signal and outputting a corrected data signal.

The error correction circuit checks the data signals, which are received by it during the read-out or writing, for errors, and in the case of a detected erroneous data signal, corrects the erroneous data signal by inverting it and outputs this corrected data signal. Consequently, the invention provides a memory architecture and an operating method which lead to an efficient realization of an error-tolerant memory. As a result of this, in particular the abovementioned artifacts, such as, VRT can be corrected without being manifested externally to the user of the memory.

In this case, the invention has the advantage that an implementation of an error correction circuit requires practically no additional area outlay and causes virtually no impairment of the memory access times. Since, in principle, any form of single-bit errors can be corrected by the error correction circuit, the redundancy provided in the form of redundant memory cells can be correspondingly reduced. An additional area outlay that is initially necessary in connection with the error correction circuit can thus be practically compensated for.

In one embodiment of the invention, a logic circuit is provided in the error correction circuit. This logic circuit checks the received data signals for errors in accordance with an error correction method according to Hamming, and in the case of a detected erroneous data signal, corrects the erroneous data signal by inverting it. The application of the Hamming method is associated with the observation that usually only a single memory cell of the entire memory is affected by VRT in a semiconductor memory. The implementation of the Hamming method enables an efficient and comparatively simple realization of an error-tolerant memory.

In a further advantageous embodiment of the memory, the memory is designed in a so-called prefetch architecture. In a prefetch architecture, data of a first bit width from different areas of the memory cell array are fed in parallel from the memory cell array to the read/write amplifier and output successively in units of a second bit width. In this case, the error correction circuit is advantageously used for checking and correcting the units of data of the second bit width. The additional area outlay can be kept particularly small in the case of a memory in prefetch architecture.

In particular, the memory cell array is subdivided into a plurality of memory cell blocks, which are connected to the read/write amplifier for the parallel read-out or writing of the data. The error correction circuit is advantageously connected between the read/write amplifier, embodied as a second read/write amplifier (secondary sense amplifier), and an output circuit for outputting the data, which is embodied as a multiplexer circuit. In general, it has been recognized as advantageous that, in the case of a greater degree of "prefetching" (for example in the case of a transition from eight-fold prefetch to 16-fold prefetch), the additional area outlay in connection with the error correction circuit furthermore decreases significantly.

It has been recognized as the basis of a further advantageous embodiment of the invention that the so-called refresh mode of a dynamic memory module can be used as a functional test for detecting memory cells affected by VRT. In a refresh mode of a dynamic memory, stored data signals of selected memory cells are refreshed. In accordance with one embodiment of the invention, the error correction circuit and the read/write amplifier can be activated in the refresh mode of the memory. In this mode, the error correction circuit checks the data signals being refreshed, which are received by it, for errors, and in the case of a detected erroneous data signal, corrects the erroneous data signal by inverting it. The corrected data signal is subsequently written back to the relevant memory cell. This enables an efficient module test for detecting VRT during the operation of the memory.

In a further advantageous embodiment of the invention, a memory circuit is connected to the error correction circuit. This memory circuit can store an address of a memory cell in which an erroneous data signal is stored. Furthermore, it is advantageous to provide a repair circuit connected to the error correction circuit and having electrically programmable elements, for example, in the form of electrical fuses. This serves for driving the error correction circuit in such a way that checking and correction by the error correction circuit are effected only in the case when a data word has an erroneous data signal or bit stored in a memory cell and the erroneous data signal is detected. This enables an efficient repair of the memory during operation. This is based on the insight that, according to experience, an error on account of VRT usually occurs only in an individual memory cell of the memory.

With the foregoing and other objects in view there is provided, in accordance with the invention, a method for operating an integrated memory. The method includes steps of: providing a memory cell array including a plurality of memory cells; providing a read/write amplifier for evaluating and amplifying data signals being written to or read out from the plurality of memory cells; connecting an error correction circuit to the read/write amplifier; providing the error correction circuit with data signals of selected memory cells that are being written to or read out from; and in the error correction circuit, checking the data signals for errors, and when detecting an erroneous data signal, correcting the erroneous data signal by inverting the erroneous data signal and outputting a corrected data signal.

In accordance with an added feature of the invention, the step of checking the data signals for errors is performed using a Hamming error correction method.

In accordance with an additional feature of the invention, the step of checking the data signals for errors is performed in a refresh mode in which stored data signals of selected memory cells will be refreshed; and during the step of checking the data signals for errors, the error correction circuit checks the data signals that will be refreshed for errors, and when an erroneous data signal is detected, the error correction circuit provides the corrected data signal by inverting the erroneous data signal, and the corrected data signal is subsequently written back to a relevant memory cell.

In accordance with another feature of the invention, the method includes: performing the step of checking the data signals for errors using a Hamming error correction method implemented by the error correction circuit; for each data word of a plurality of data words, checking a parity for a plurality of data bit groups of different selected bits of the data word; and including data signals from different word lines of the memory cell array when performing the step of checking the parity.

In accordance with a further feature of the invention, the method includes: performing the step of checking the data signals for errors using a Hamming error correction method implemented by the error correction circuit; for each data word of a plurality of data words, obtaining a plurality of parity results by checking a parity for a plurality of data bit groups of different selected bits of the data word; and storing the plurality of the parity results of each data word of the plurality of the data words in memory cells present on a plurality of word lines.

In accordance with a further added feature of the invention, the method includes: performing the step of checking the data signals for errors using a Hamming error correction method implemented by the error correction circuit; for each data word of a plurality of data words, obtaining a plurality of parity results by checking a parity for a plurality of data bit groups of different selected bits of the data word; and storing the plurality of the parity results of each data word of the plurality of the data words in memory cells present on at least one word line exclusively provided therefore.

In accordance with another added feature of the invention, the method includes: performing the step of checking the data signals for errors using a Hamming error correction method implemented by the error correction circuit; for each data word of a plurality of data words, obtaining a plurality of parity results by checking a parity for a plurality of data bit groups of different selected bits of the data word; and storing the plurality of the parity results of each data word of the plurality of the data words in memory cells present on at least one bit line exclusively provided therefore.

In accordance with another additional feature of the invention, the method includes: performing the step of checking the data signals for errors using a Hamming error correction method implemented by the error correction circuit; for each data word of a plurality of data words, obtaining a plurality of parity results by checking a parity for a plurality of data bit groups of different selected bits of the data word; and storing-sequential ones of the plurality of the parity results of each data word of the plurality of the data words in memory locations within an already activated word line or word line set.

Other features which are considered as characteristic for the invention are set forth in the appended claims.

Although the invention is illustrated and described herein as embodied in an integrated memory and method for operating an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
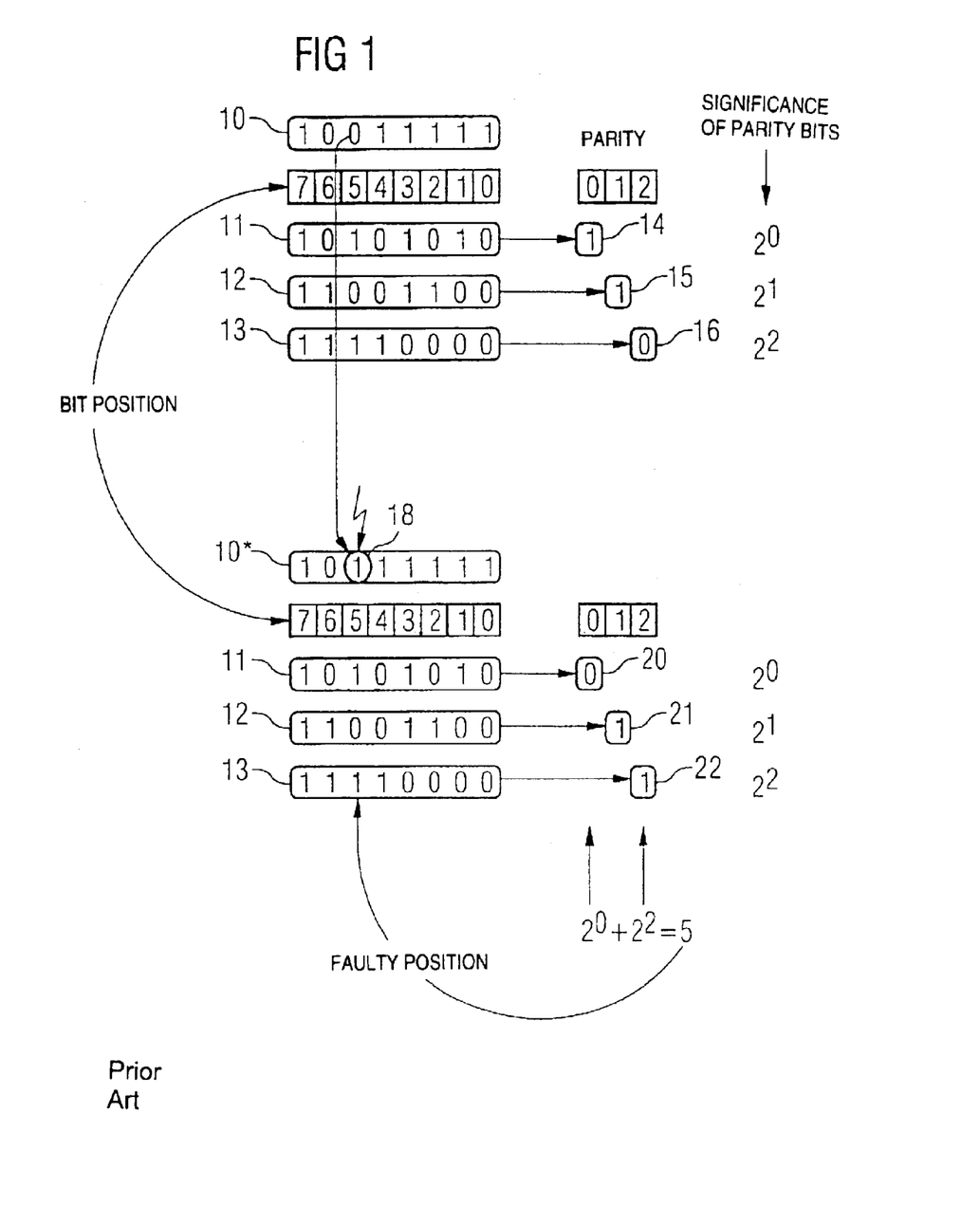
FIG. 1 is a basic illustration for elucidating the Hamming method.

Referring now to the figures of the drawing in detail and first, particularly, to FIG. 1 thereof, there is shown a fundamentally known Hamming method for the basic realization of an error-tolerant integrated memory. The known Hamming method will be applied by way of example to a data word 10 having a length of eight bits. The individual bits or bit positions shall be designated by 0 to 7. First, a parity check is performed, i.e. the number of ones in the data word 10 is counted. When there are an even number of ones in the data word, parity 0 is present, otherwise parity 1 is present. With application of the Hamming method, the parity is checked for specific data bit groups of different bits or bit positions of the data word 10. This is represented by the selection words 11, 12 and 13 in FIG. 1. A 1 represented in the respective selection word 11, 12, 13 means that the parity is checked for these bit positions of the data word 10. The parity results 14, 15 and 16 represented in FIG. 1 are accordingly produced. Each of these parity results corresponds to a specified significance $2^0$, $2^1$ and $2^2$.

It shall now be assumed below that an individual error occurs at bit position 5, i.e. the content of the relevant memory cell changes from 0, represented in data word 10, to 1, represented in data word 10*. The individual error is designated by 18. When the now erroneous data word 10* is read, the parity is again calculated and compared with the previously stored result of the previous parity calculation. The parity results 20, 21 and 22 are now produced for the erroneous data word 10*. A comparison with the corresponding old parity results produces a deviation in the case of the parity results 20 and 22 in comparison with the parity results 14 and 16. The parity results 20 and 22 correspond to the significances $2^0$ and $2^2$. According to the Hamming method, this means that the individual error occurred at the bit position $2^0 + 2^2 = 5$ of the original data word 10.

This erroneous bit can then be corrected by inverting the read memory cell content of bit position 5. The Hamming method generally yields a correct result only when an individual error occurs in the data word 10. The Hamming method cannot be employed when a plurality of bit errors occur in the data word 10. In an extension of the Hamming method, it is furthermore possible to detect and correct single-bit errors in the memory cells for storing the parity results themselves.

Figure 2:
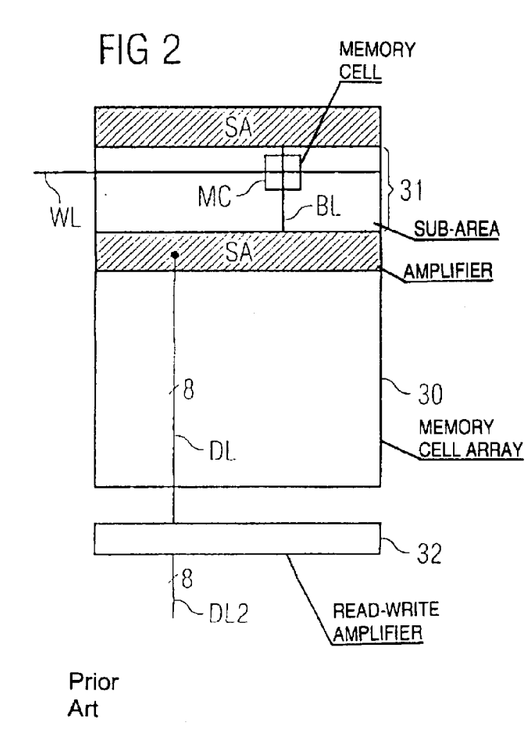
FIG. 2 is a diagrammatic illustration of a conventional integrated memory.

FIG. 2 diagrammatically illustrates a customary memory architecture of an integrated memory. The memory has memory cells MC, which are arranged at crossover points of word lines WL and bit lines BL. The word lines WL serve for the selection of the corresponding memory cells via a respectively connected selection transistor; the bit lines BL serve for reading out or writing a data signal to a relevant memory cell MC. The memory cell array 30 is subdivided into sub-areas 31 that are determined by the length of a word line WL and bit line BL. When data are read, all the memory cells connected to the word line WL are read and amplified by an amplifier SA. To that end, a wordsline WL is activated. This has the effect that the memory cells MC connected to the word line pass their charge onto the associated bit lines BL. The bit lines BL are connected to the amplifiers SA, which amplify the signal values, which are weak under certain circumstances (may lie in the region of 50 mV), to full logic levels of 1 to 2 V, for example.

Usually, in a memory such as that shown in FIG. 2, 1024 bits, for example, are read simultaneously and the signal values are amplified by amplifiers SA. This is followed by selecting a partial word of 8 bits, for example, which are forwarded via the data line DL and are again amplified by a read/write amplifier 32 (so-called secondary sense amplifier) to full logic levels and output onto the data lines DL2. The use of error-tolerant methods is difficult here. An application to all the memory cells of the word line WL is virtually impossible, in principle, since too many memory cells are involved. This would require too much chip area, on account of the architecture of the memory cell array. Furthermore, subsequently writing parity results to redundant memory cells is difficult at this point and would lead to considerably slowing down the write operation. The application of an error-tolerant method to the data lines DL2 likewise appears to be not really feasible. As illustrated in FIG. 1, three parity bits are required to correct eight data bits according to the Hamming method. In the case of a memory constructed in accordance with FIG. 2, this means that it is necessary to provide further bits to the extent of about 35%, which thus leads to a considerable enlargement of the chip area.

Figure 3:
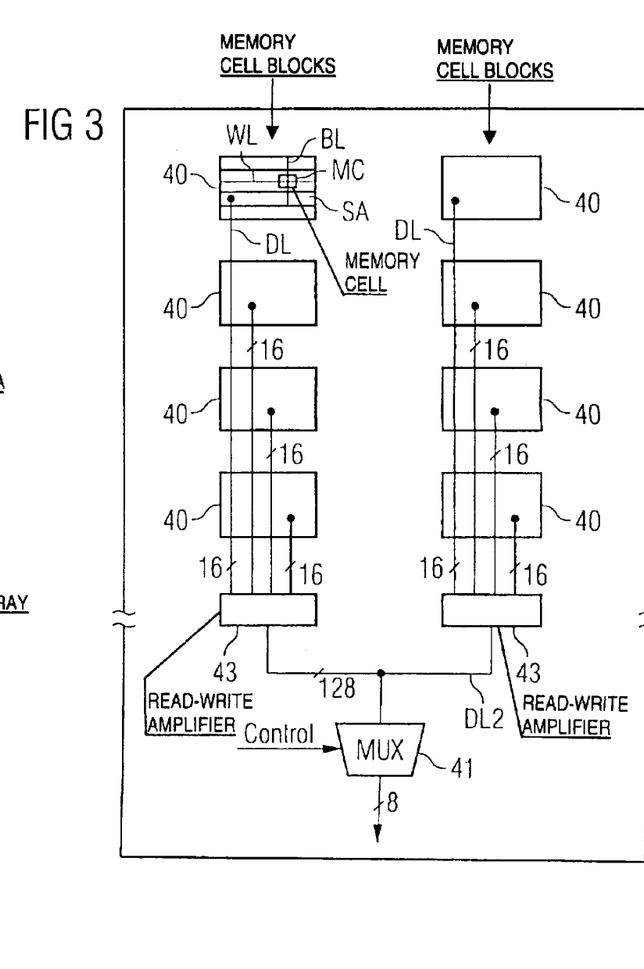
FIG. 3 is a diagrammatic illustration of an integrated memory with a prefetch architecture.
Figure 4:
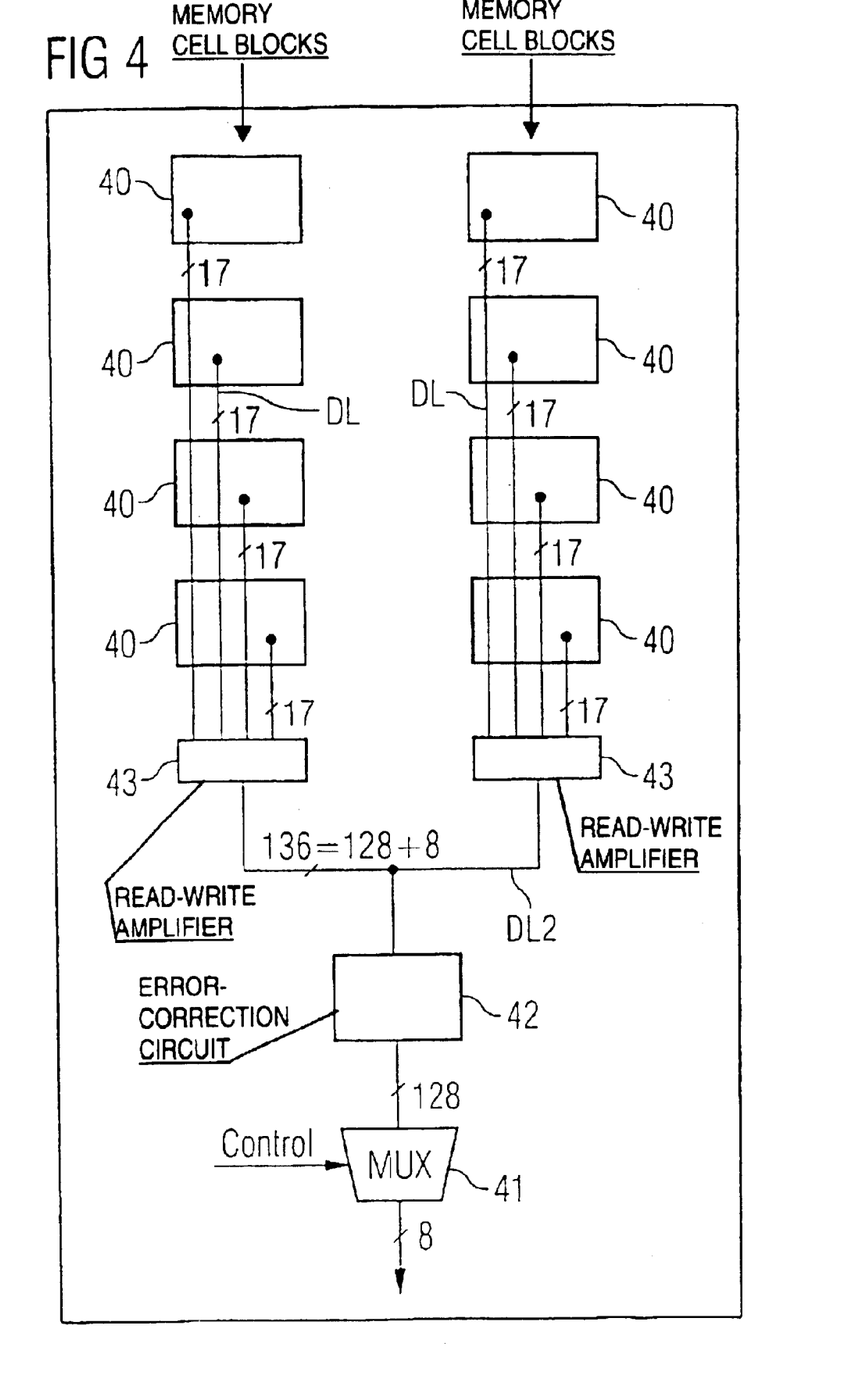
FIG. 4 is a diagrammatic illustration of an inventive integrated memory with a prefetch architecture.

FIG. 3 diagrammatically illustrates an integrated memory with a so-called prefetch architecture. A memory in a prefetch architecture has the advantage over a conventional architecture in accordance with FIG. 2 that data can be read out or written in at a higher frequency. The memory in accordance with FIG. 3 is subdivided into different memory cell blocks 40. The memory cell blocks 40 are connected to a read/write amplifier 43 (secondary sense amplifier) for the parallel read-out or writing of data. For a read-out operation, a respective word line WL is activated in each of the eight memory cell blocks 40 illustrated. In this example, 16 selected data bits per memory cell block are forwarded via data lines DL. Consequently, 128 data bits are provided overall. A 16-fold prefetch is involved in the example shown in FIG. 3, since only 8 bits of the 128 data bits provided are forwarded via an output circuit in the form of a multiplexer 41. These data having a width of 8 bits can be forwarded at a very high frequency. Using a (slow) cell array access, 128 bits are provided and can be forwarded at a high frequency in units of 8 bits, for example, to the outputs of the memory chip. FIG. 4 diagrammatically illustrates the construction of an integrated memory in a prefetch architecture, which, in contrast to the memory shown in FIG. 3, inventively has an error correction circuit 42. The error correction circuit 42 is connected to the read/write amplifiers 43, which serve for evaluating and amplifying data signals that are to be read out or written. The error correction circuit 42 can be activated for reading out or writing data from the memory cell blocks 40. The error correction circuit receives corresponding data signals during the read-out or writing of the data and checks the data signals for freedom from errors. In the case of a detected erroneous data signal, the erroneous data signal is corrected by being inverted and is output to the multiplexer circuit 41 for a read-out operation. In the error correction circuit 42 there is provided, in particular, a corresponding logic circuit that checks the received data signals for freedom from errors in accordance with the Hamming error correction method, and in the case of an erroneous data signal, corrects the erroneous data signal by inverting it.

When the Hamming method is employed, in the case of 128 data bits, a total of 8 parity bits are required for realizing the error correction. The additional area outlay is thereby reduced to about 7%. As already explained with reference to FIG. 1, when the Hamming method is employed, parities are in each case checked for a plurality of data bit groups of different selected bits of a data word.

A plurality of embodiments are conceivable in this regard. First it is advantageous if data signals from different word lines of the memory cell array are included in the parity check. Furthermore, it is advantageous to store the parity results of a checked data word that are obtained in this way in memory cells present on a plurality of word lines. Moreover, it is advantageous to store the parity results of a checked data word in memory cells present on at least one word line or bit line provided exclusively therefor. Furthermore, it is advantageous if the memory locations provided for storing the parity results of a checked data word, for sequentially checked data bit groups, are provided within an already activated word line or word line set, so that no new word line has to be activated.

In accordance with the embodiment of the invention shown in FIG. 4, further memory cells are provided in which parity results obtained are stored. In this case, the memory cell blocks 40 each contain at least one of the further memory cells for storing a parity result. The additional eight memory bits that are thus required are provided here by a respective additional data line DL per memory cell block 40. Seventeen data lines are thus obtained instead of 16 data lines as shown in FIG. 3. In another embodiment of the invention, it is possible to combine the further memory cells for storing the parity results in a separate memory cell block.

If a memory constructed in accordance with FIG. 4 with 16-fold prefetch is modified toward a higher degree of "prefetching", the additional area outlay furthermore decreases significantly (additional area outlay approximately 3 to 4% in the case of 256 bit prefetching). Since the error correction method corrects any form of single-bit errors, the general redundancy in the form of redundant memory cells can be correspondingly reduced. The additional area outlay associated with the error correction circuit can thus be compensated for.

The error correction described using the Hamming method can be realized, in principle, with any correction method suitable therefore. In this case, it is not a further problem to develop a corresponding logic circuit in the error correction circuit 42. The explanations above referring to a read-out operation apply analogously to an operation of writing to the memory cells.

An efficient realization of a module test for detecting memory cells with VRT behavior in accordance with one embodiment of the present invention will be explained in more detail below with reference to FIG. 5.

Since dynamic memory cells of a DRAM slowly lose their charge, it is usually the case that after an operating time of 64 ms, for example, the signal of the memory cell has to be read and amplified and written back to the corresponding memory cell. Various so-called refresh methods exist for this purpose. In particular, the so-called self-refresh method is employed below. In the case of this method, the memory module independently generates a refresh signal or receives from a controller the command to execute a refresh operation. In this case, the memory module independently generates the corresponding word line addresses in order to read memory cells word line by word line and to write the information, after having been amplified, back to the cells.

This refresh mechanism is extended according to the invention for the purpose of detecting VRT errors. In this case, the actual error detection is performed by error-tolerant logic, as explained with reference to FIG. 4. For a self-refresh mode, in the case of a memory in accordance with FIG. 4, the data lines DL, DL2, the read/write amplifiers 43 and the error correction circuit 42 are activated. Afterward, 128 bits are selected and corrected by an error-tolerant method.

Figure 5:
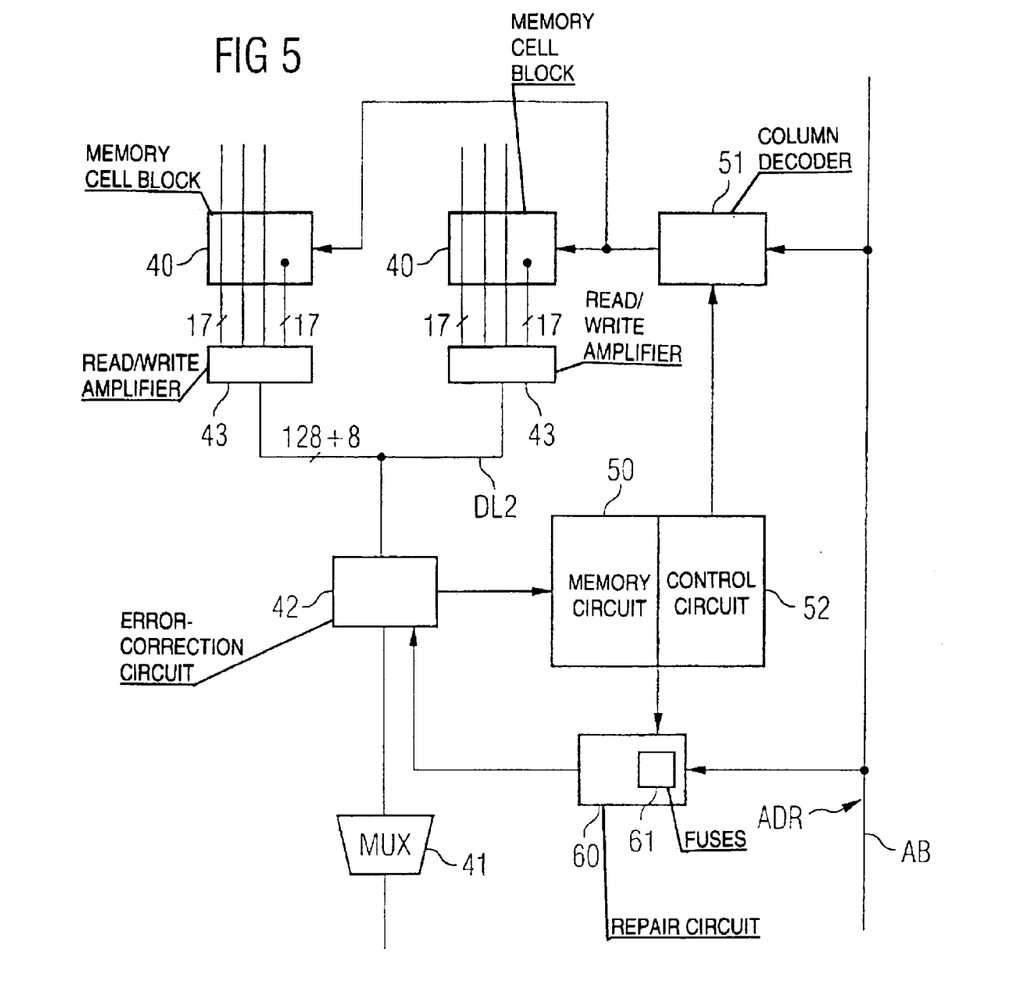
FIG. 5 is a diagrammatic illustration of a further embodiment of an inventive integrated memory with a prefetch architecture.

FIG. 5 shows a detail from an embodiment of a memory that has a prefetch architecture and is designed similarly to the memory shown in FIG. 4. In the case of a memory in accordance with FIG. 5, a memory circuit 50 is provided in addition to the error correction circuit 42. The memory circuit 50 is connected to the error correction circuit 42. When a correction of a data signal occurs, the address of the relevant defective memory cell can be stored using the memory circuit 50. Although only very few bits are checked with each refresh event, a memory cell refresh must be carried out continuously and continually for all of the memory cells of a DRAM. For this reason, a VRT test realized in this way is highly effective.

Furthermore, in the case of the memory shown in FIG. 5, a control circuit 52 is connected to the error correction circuit 42. This control circuit 52 drives a column decoder 51 for driving the memory cell blocks 40. The control circuit 52 continuously alters a column address of memory cells that are to be selected for the refresh mode, so that all the memory cells are checked in cyclic repetition. As a result, new data bits are continuously selected from the word line currently in refresh mode and are checked by an error-tolerant method. A column decoder 51 is provided anyway for the normal operation of the memory.

The previously described inventive concept for realizing an error-tolerant memory can be extended to the effect that practically no additional memory cells are necessary. This can be done e.g. by storing, in the extreme case, only the parity information for a comparatively small number of bits. For the correction of 8 data bits, according to the Hamming method, only 3 bits are required for storing parity results, which can be stored for example in dedicated registers. In the aforementioned extreme case, after 64 ms, for example, the first 8 bits would be tested for failure. Afterward, by using corresponding logic circuits in the error correction circuit 42 and memory circuit 50 and control circuit 52, the next 8 bits are selected, parity-coded and, after a further 64 ms, checked for failure. A refresh cycle is 64 ms in this case, i.e. the memory cell content along a word line is in this case read out and amplified again by refresh at the latest after 64 ms. In this way, a 64 Mb memory would be fully tested once after 64 Mb/8 bits×64 ms≈150 h. A continuous VRT check of the memory can be effected in this case. As soon as a VRT event takes place within the 64 ms interval checked, this is detected. Of course, the check can be correspondingly accelerated by increased parallelism.

Since, as a rule, VRT usually occurs only in an individual cell of a memory, in accordance with a further embodiment of the invention, a repair can be effected in such a way that the error-tolerant concept, as described last, is then not subsequently activated for all the memory cells of the semiconductor memory, but rather permanently for the affected memory cell word.

Memory cells identified as defective can be repaired using electrical fuse structures (connections/interruptions which can be permanently interrupted or closed using electrical signals). To that end, provision is made of a repair circuit 60, which is connected to the error correction circuit 42 and has electrically programmable fuses 61. The repair circuit 60 serves for driving the error correction circuit 42 in such a way that checking and correction are only effected when a data word is associated a memory cell in which an erroneous data signal has been detected. An address of a defective memory cell is stored by the electrical fuses 61. In the event of a later memory cell access via the address bus AB on which an address ADR is present, an address of a defective memory cell is identified by the repair circuit 60, which drives the error correction circuit 42 accordingly.

The sequential use of error-tolerant correction methods according to the invention requires such little additional chip area that correction methods which allow a correction of multiple-bit errors can also readily be used.

I claim:

1. An integrated memory, comprising:
    a memory cell array including a plurality of memory cells;
    a read/write amplifier for evaluating and amplifying data signals being read out from or written to said plurality of memory cells of said memory cell array; and
    an error correction circuit connected to said read/write amplifier;
    said error correction circuit capable of being activated when reading out from or writing to said memory cell array;
    said error correction circuit for receiving and checking the data signals, being read out from or written to said memory cell array, for errors;
    said error correction circuit, upon detecting an erroneous data signal, correcting the erroneous data signal by inverting the erroneous data signal and outputting a corrected data signal;
    the integrated memory having a prefetch architecture utilized such that data of a first bit width from different areas of said memory cell array being fed in parallel from said memory cell array to said read/write amplifier and being successively output in units of a second bit width; and
    said error correction circuit checking and correcting the data in the units of the second bit width.

2. The integrated memory according to claim 1, wherein:
    said error correction circuit includes a logic circuit for checking the data signals, which have been received by said error correction circuit, for errors in accordance with a Hamming error correction method; and
    when the erroneous data signal has been detected, said logic circuit corrects the erroneous data signal by inverting the erroneous data signal.

3. The integrated memory according to claim 1, comprising:
    a multiplexer circuit;
    said memory cell array being subdivided into a plurality of memory cell blocks connected to said read/write amplifier for parallel reading-out or writing the data of the first bit width;
    said multiplexer circuit for outputting the data of the second bit width;
    said error correction circuit connected between said read/write amplifier and said multiplexer circuit; and
    said read/write amplifier embodied as a second read/write amplifier.

4. The integrated memory according to claim 1, comprising:
    further memory cells for storing parity results;
    said error correction circuit including a logic circuit for checking the data signals, which have been received by said error correction circuit, for errors in accordance with a Hamming error correction method;
    upon detecting the erroneous data signal, said logic circuit correcting the erroneous data signal by inverting the erroneous data signal;
    said parity results being obtained by checking a parity for a plurality of data bit groups of different selected bits of a data word; and
    said memory cell array being subdivided into a plurality of memory cell blocks.

5. The integrated memory according to claim 4, wherein each one of said plurality of memory cell blocks includes at least one of said further memory cells.

6. The integrated memory according to claim 4, wherein said further memory cells are combined into a separate one of said plurality of said memory cell blocks.

7. The integrated memory according to claim 1, comprising:
    a memory circuit connected to said error correction circuit;
    said memory circuit for storing an address of a memory cell storing an erroneous data signal.

8. The integrated memory according to claim 1, wherein said error correction circuit and said read/write amplifier can be activated in a refresh mode during which stored data signals of selected ones of said plurality of memory cells are refreshed.

9. The integrated memory according to claim 8, comprising:
    a control circuit connected to said error correction circuit;
    said memory cell array including a column decoder; and
    said control circuit driving said column decoder and continuously altering a column address of ones of said plurality of memory cells that will be selected for the refresh mode so that all of said plurality of said memory cells can be checked in cyclic repetition.

10. The integrated memory according to claim 9, comprising:
    a repair circuit connected to said error correction circuit;
    said repair circuit including electrically programmable elements for driving said error correction circuit such that checking and correction are effected only when a data word is associated with a memory cell in which an erroneous data signal has been detected.

11. A method for operating an integrated memory, which comprises:
    providing a memory cell array including a plurality of memory cells;
    providing a read/write amplifier for evaluating and amplifying data signals being written to or read out from the plurality of memory cells;
    connecting an error correction circuit to the read/write amplifier;

providing the error correction circuit with data signals of selected memory cells that are being written to or read out from;

in the error correction circuit, checking the data signals for errors, and when detecting an erroneous data signal, correcting the erroneous data signal by inverting the erroneous data signal and outputting a corrected data signal;

forming the integrated memory with a prefetch architecture such that data of a first bit width from different areas of the memory cell array are fed in parallel from the memory cell array to the read/write amplifier and being successively output in units of a second bit width; and checking and correcting, via the error correction circuit, the data in the units of the second bit width.

12. The method according to claim 11, wherein the step of checking the data signals for errors is performed using a Hamming error correction method.

13. The method according to claim 11, wherein:

the step of checking the data signals for errors is performed in a refresh mode in which stored data signals of selected memory cells will be refreshed; and during the step of checking the data signals for errors, the error correction circuit checks the data signals that will be refreshed for errors, and when an erroneous data signal is detected, the error correction circuit provides the corrected data signal by inverting the erroneous data signal, and the corrected data signal is subsequently written back to a relevant memory cell.

14. The method according to claim 11, which comprises:

performing the step of checking the data signals for errors using a Hamming error correction method implemented by the error correction circuit;

for each data word of a plurality of data words, checking a parity for a plurality of data bit groups of different selected bits of the data word; and including data signals from different word lines of the memory cell array when performing the step of checking the parity.

15. The method according to claim 11, which comprises:

performing the step of checking the data signals for errors using a Hamming error correction method implemented by the error correction circuit;

for each data word of a plurality of data words, obtaining a plurality of parity results by checking a parity for a plurality of data bit groups of different selected bits of the data word; and storing the plurality of the parity results of each data word of the plurality of the data words in memory cells present on a plurality of word lines.

16. The method according to claim 11, which comprises:

performing the step of checking the data signals for errors using a Hamming error correction method implemented by the error correction circuit;

for each data word of a plurality of data words, obtaining a plurality of parity results by checking a parity for a plurality of data bit groups of different selected bits of the data word; and storing the plurality of the parity results of each data word of the plurality of the data words in memory cells present on at least one word line exclusively provided therefore.

17. The method according to claim 11, which comprises:

performing the step of checking the data signals for errors using a Hamming error correction method implemented by the error correction circuit;

for each data word of a plurality of data words, obtaining a plurality of parity results by checking a parity for a plurality of data bit groups of different selected bits of the data word; and storing the plurality of the parity results of each data word of the plurality of the data words in memory cells present on at least one bit line exclusively provided therefore.

18. The method according to claim 11, which comprises:

performing the step of checking the data signals for errors using a Hamming error correction method implemented by the error correction circuit;

for each data word of a plurality of data words, obtaining a plurality of parity results by checking a parity for a plurality of data bit groups of different selected bits of the data word; and storing sequential ones of the plurality of the parity results of each data word of the plurality of the data words in memory locations within an already activated word line or word line set.

* * * * *